(12) United States Patent
Shimada et al.

(10) Patent No.: US 10,650,900 B2
(45) Date of Patent: May 12, 2020

(54) STACKED TYPE SEMICONDUCTOR MEMORY DEVICE AND METHOD FOR READING THE SAME

(71) Applicant: TOSHIBA MEMORY CORPORATION, Tokyo (JP)

(72) Inventors: Yusuke Shimada, Yokkaichi Mie (JP); Fumitaka Arai, Yokkaichi Mie (JP); Tatsuya Kato, Yokkaichi Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 15/923,501

(22) Filed: Mar. 16, 2018

(65) Prior Publication Data

US 2019/0074066 A1 Mar. 7, 2019

(30) Foreign Application Priority Data

Sep. 7, 2017 (JP) ................. 2017-172036

(51) Int. Cl.
*G11C 16/26* (2006.01)
*H01L 27/1157* (2017.01)
*G11C 16/04* (2006.01)
*H01L 27/11582* (2017.01)
*H01L 27/11565* (2017.01)

(52) U.S. Cl.
CPC .......... *G11C 16/26* (2013.01); *G11C 16/0483* (2013.01); *H01L 27/1157* (2013.01); *H01L 27/11565* (2013.01); *H01L 27/11582* (2013.01)

(58) Field of Classification Search
CPC ............. G11C 16/0483; G11C 16/26
USPC ........................ 365/185.01, 185.17
See application file for complete search history.

(56) References Cited

U.S. PATENT DOCUMENTS

| | | |
|---|---|---|
| 9,147,468 B1* | 9/2015 | Lue ............. G11C 11/5671 |
| 9,524,980 B2 | 12/2016 | Lue |
| 2010/0159657 A1 | 6/2010 | Arai et al. |
| 2014/0001530 A1* | 1/2014 | Song ............. H01L 29/78 257/314 |
| 2015/0118811 A1 | 4/2015 | Makala et al. |
| 2015/0340369 A1 | 11/2015 | Lue |
| 2015/0340371 A1* | 11/2015 | Lue ............. H01L 21/28282 257/324 |
| 2016/0071593 A1 | 3/2016 | Hashimoto |

FOREIGN PATENT DOCUMENTS

JP 2015-228484 A 12/2015
JP 2016-058118 A 4/2016

* cited by examiner

*Primary Examiner* — Alexander Sofocleous
*Assistant Examiner* — Alfredo Bermudez
(74) *Attorney, Agent, or Firm* — Foley & Lardner LLP (57) ABSTRACT

A semiconductor memory device includes a first NAND string and a second NAND string sharing a channel and being connected in parallel. When reading a value from a first memory cell transistor of the first NAND string, a first potential is applied to a gate of a second memory cell transistor of the first NAND string and a gate of at least one of fourth memory cell transistors opposing the second memory cell transistor, a second potential is applied to a gate of a third memory cell transistor of the second NAND string opposing the first memory cell transistor, and a gate potential of the first memory cell transistor is swept between the second potential and the first potential. The second potential is lower than the first potential.

12 Claims, 6 Drawing Sheets

STACKED TYPE SEMICONDUCTOR MEMORY DEVICE AND METHOD FOR READING THE SAME

CROSS-REFERENCE TO RELATED APPLICATIONS

This application is based upon and claims the benefit of priority from Japanese Patent Application No. 2017-172036, filed on Sep. 7, 2017; the entire contents of which are incorporated herein by reference.

FIELD

Embodiments relate to a semiconductor memory device and a method for driving the same.

BACKGROUND

In recent years, a stacked type semiconductor memory device has been proposed in which memory cell transistors are integrated three-dimensionally. In such a stacked type semiconductor memory device, a stacked body in which electrode films and insulating films are stacked alternately is provided on a semiconductor substrate; and semiconductor pillars that pierce the stacked body are provided. The memory cell transistors are formed at each crossing portion between the electrode films and the semiconductor pillars. Data is stored by changing thresholds of the memory cell transistors; and the data is read by determining the thresholds of the memory cell transistors. For such a stacked type semiconductor memory device, it is predicted that the on-current of the read operation will decrease and it will be difficult to read the data as the semiconductor pillars are downscaled to increase the integration.

DETAILED DESCRIPTION

A semiconductor memory device according to an embodiment includes a first interconnect, a second interconnect, a first NAND string and a second NAND string sharing a channel and being connected in parallel between the first interconnect and the second interconnect, and a drive circuit. The first and second NAND strings each includes a plurality of memory cell transistors connected in series. When reading a value from a first memory cell transistor of the plurality of memory cell transistors belonging to the first NAND string, the drive circuit performing applying a first potential to a gate of a second memory cell transistor of the plurality of memory cell transistors belonging to the first NAND string other than the first memory cell transistor, applying a second potential to a gate of a third memory cell transistor of the plurality of memory cell transistors belonging to the second NAND string, applying the first potential to a gate of at least one of fourth memory cell transistors of the plurality of memory cell transistors belonging to the second NAND string, and sweeping a gate potential of the first memory cell transistor between the second potential and the first potential. The third memory cell transistor opposes the first memory cell transistor. The fourth memory cell transistor opposes the second memory cell transistor and is nonadjacent to the third memory cell transistor. An absolute value of a potential difference between the second potential and a potential of the first interconnect is less than an absolute value of a potential difference between the first potential and the potential of the first interconnect.

A method for driving a semiconductor memory device according to an embodiment is a method for driving a semiconductor memory device including a first NAND string and a second NAND string sharing a channel and being connected in parallel between a first interconnect and a second interconnect. The first and second NAND strings each includes a plurality of memory cell transistors connected in series. The method includes, when reading a value from a first memory cell transistor of the plurality of memory cell transistors belonging to the first NAND string, applying a first potential to a gate of a second memory cell transistor of the plurality of memory cell transistors belonging to the first NAND string other than the first memory cell transistor, applying a second potential to a gate of a third memory cell transistor of the plurality of memory cell transistors belonging to the second NAND string, applying the first potential to a gate of at least one of fourth memory cell transistors of the plurality of memory cell transistors belonging to the second NAND string, and sweeping a gate potential of the first memory cell transistor between the second potential and the first potential. The third memory cell transistor opposes the first memory cell transistor. The fourth memory cell transistor opposes the second memory cell transistor and is nonadjacent to the third memory cell transistor. An absolute value of a potential difference between the second potential and a potential of the first interconnect is less than an absolute value of a potential difference between the first potential and the potential of the first interconnect.

First Embodiment

A first embodiment will now be described.

Figure 1:
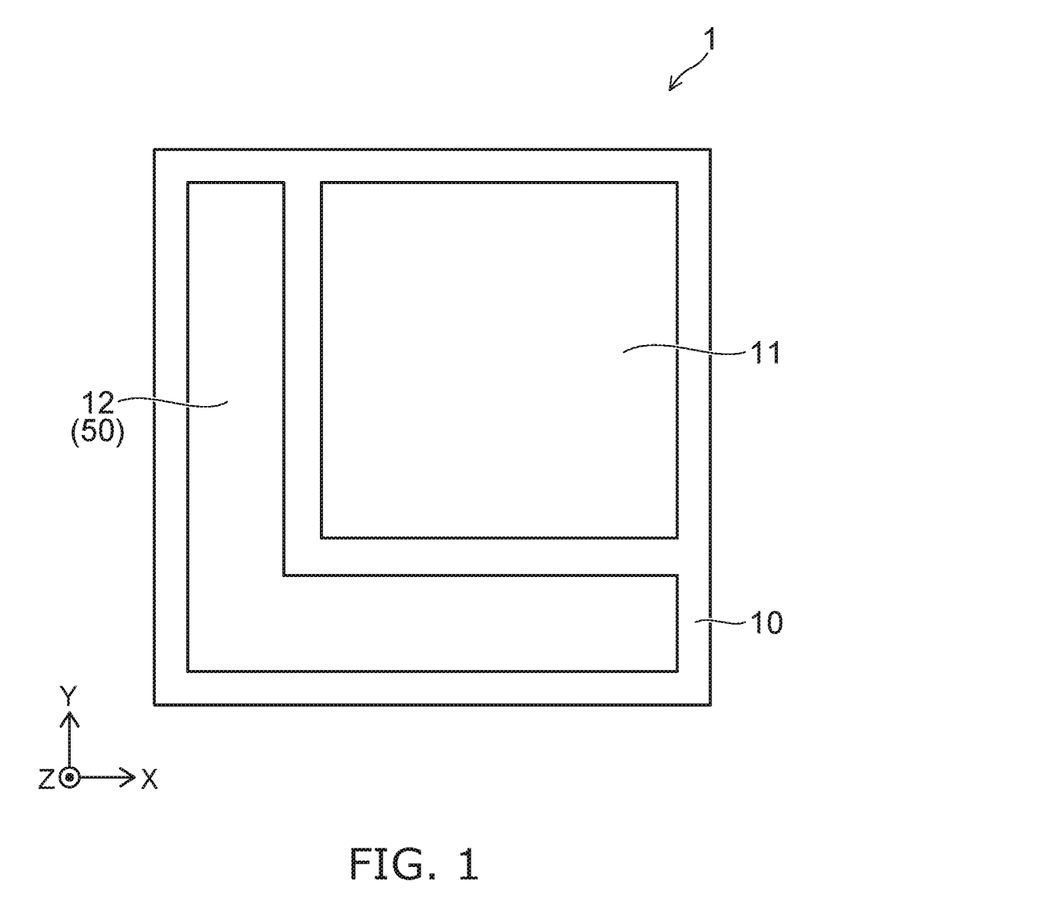
FIG. 1 is a plan view showing a semiconductor memory device according to a first embodiment.

FIG. 1 is a plan view showing a semiconductor memory device according to the embodiment.

Figure 2:
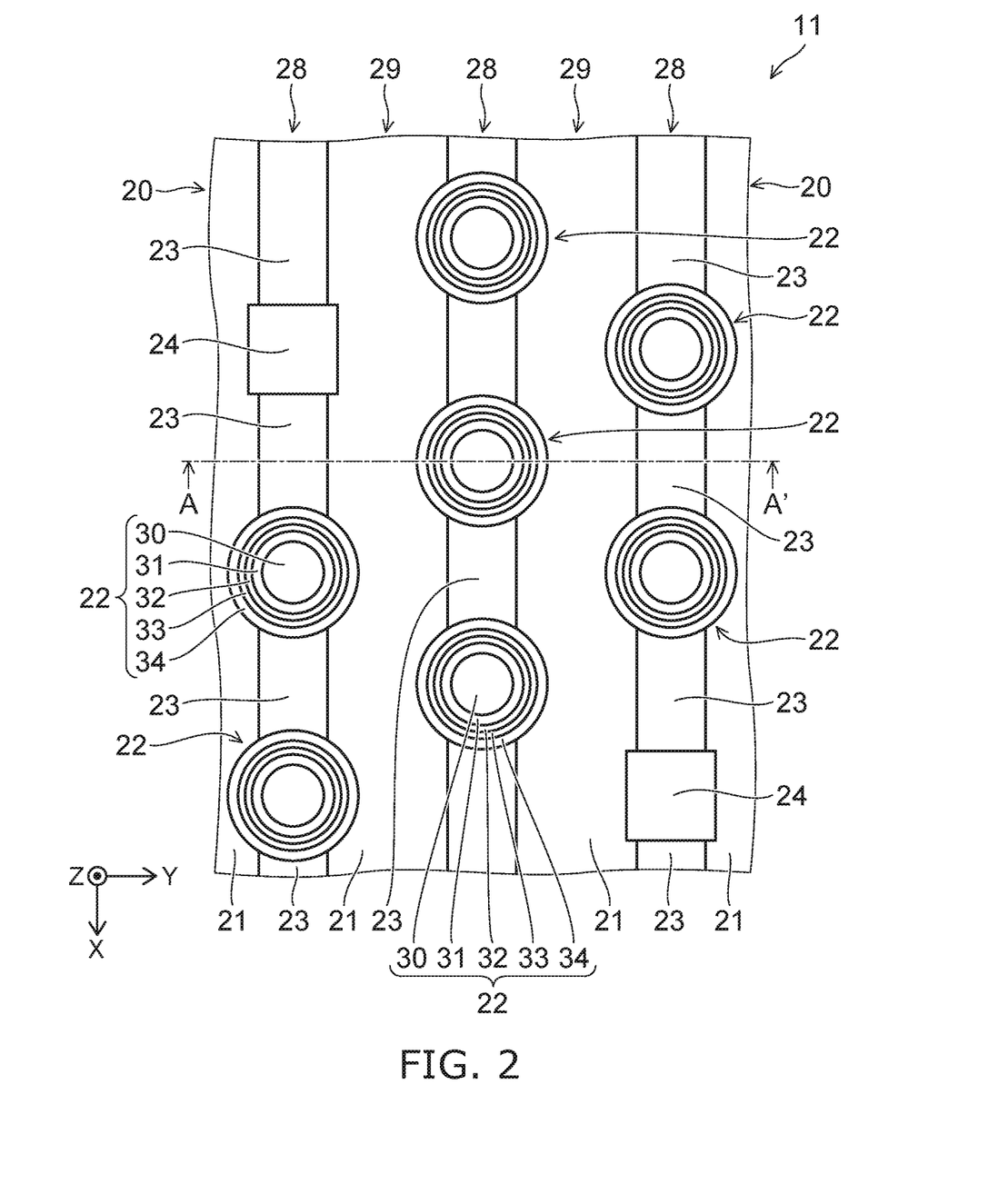
FIG. 2 is a plan view showing a memory portion of the semiconductor memory device according to the first embodiment.

FIG. 2 is a plan view showing a memory portion of the semiconductor memory device according to the embodiment.

Figure 3:
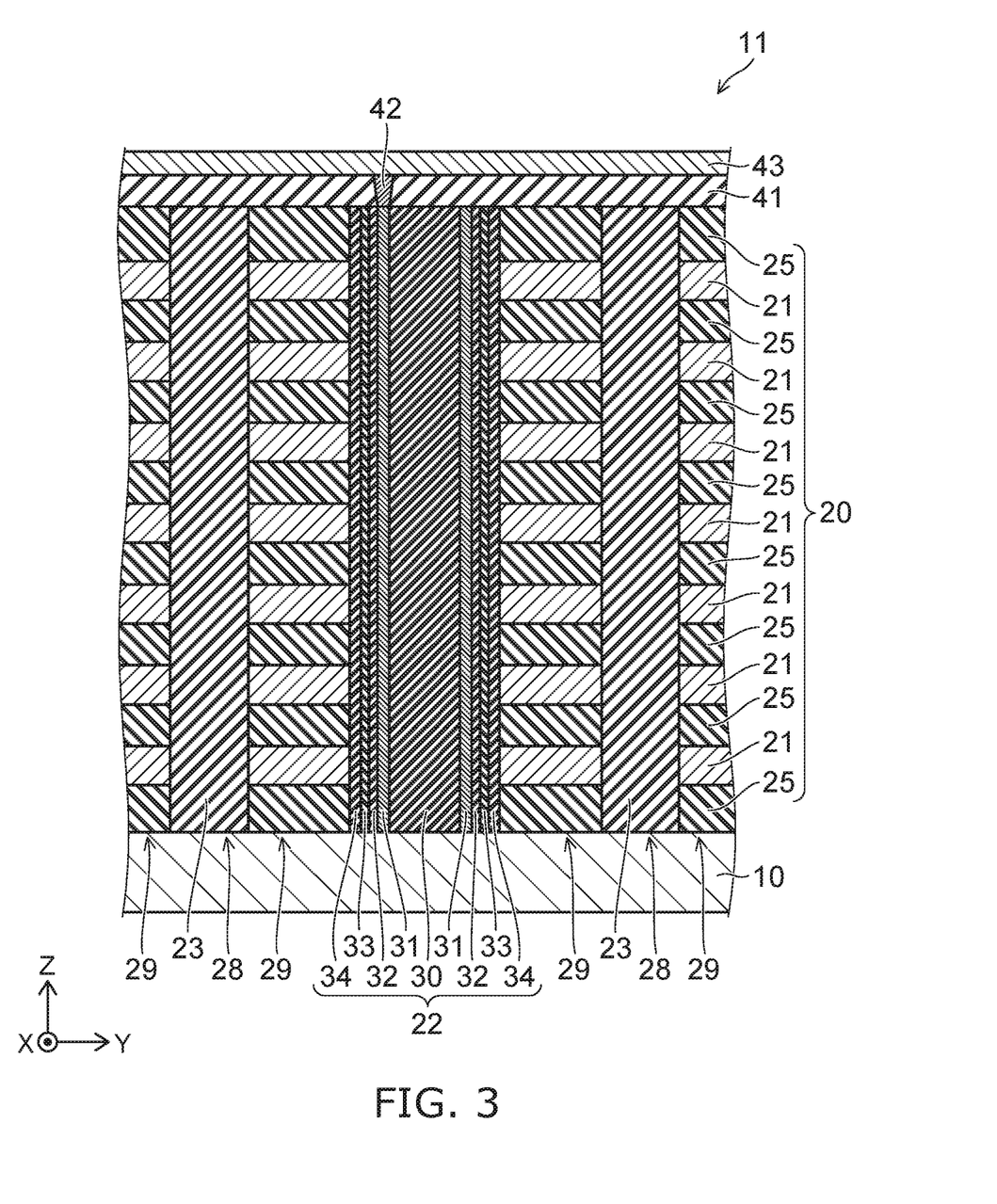
FIG. 3 is a cross-sectional view along line A-A' shown in FIG. 2.

FIG. 3 is a cross-sectional view along line A-A' shown in FIG. 2.

Figure 4:
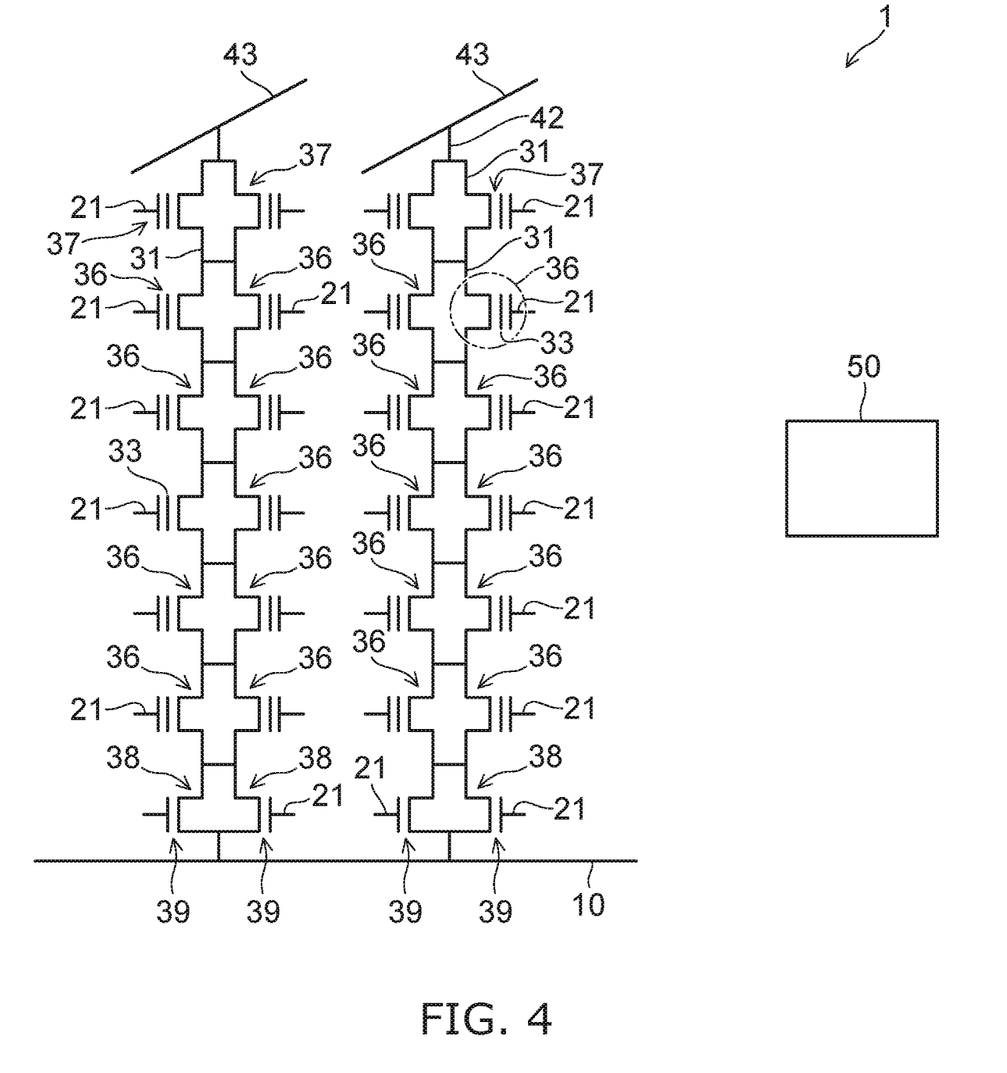
FIG. 4 is a circuit diagram showing a memory portion of the semiconductor memory device according to the first embodiment.

FIG. 4 is a circuit diagram showing the memory portion of the semiconductor memory device according to the embodiment.

The drawings are schematic and are drawn with appropriate exaggerations or omissions. For example, the components are drawn to be larger and fewer than the actual components. The numbers, dimensional ratios, etc., of the components do not always match between the drawings.

As shown in FIG. 1, a silicon substrate 10 is provided in the semiconductor memory device 1 according to the embodiment. A memory portion 11 and a drive circuit portion 12 are set on the upper surface of the silicon substrate 10.

In the memory portion 11 as shown in FIG. 2 and FIG. 3, a stacked body 20 is provided on the silicon substrate 10. In the specification hereinbelow, an XYZ orthogonal coordinate system is employed for convenience of description. Although the direction from the silicon substrate 10 toward the stacked body 20 also is called "up" and the reverse direction also is called "down," these expressions are for convenience and are independent of the direction of gravity. Up and down are generally referred to as a "Z-direction." Two mutually-orthogonal directions orthogonal to the Z-direction are taken as an "X-direction" and a "Y-direction." The drive circuit portion 12 is disposed at the side of the memory portion 11, that is, on the X-direction side and the Y-direction side.

In the specification, "silicon substrate" refers to a substrate including silicon (Si) as a major component. This is similar for the other components as well; and in the case where the material name is included in the name of the component, the material is a major component of the component. Because silicon generally is a semiconductor material, a silicon substrate is a semiconductor substrate unless otherwise indicated. This is similar for the other members as well; and as a general rule, the characteristics of the member reflect the characteristics of the major component.

Multiple word lines 21 are provided in the stacked body 20. Each of the word lines 21 extends in the X-direction. In other words, for each of the word lines 21, the length in the X-direction is longer than the length in the Y-direction and the length in the Z-direction. The multiple word lines 21 are arranged in a matrix configuration along the Y-direction and the Z-direction.

A columnar member 22 is provided between two word lines 21 of the multiple word lines 21 adjacent to each other in the Y-direction. The configuration of the columnar member 22 is a substantially circular column of which the central axis extends in the Z-direction. The length in the Z-direction of the columnar member 22 is longer than the length in the X-direction and the length in the Y-direction. An insulating member 23 is provided between the columnar members 22 adjacent to each other in the X-direction. An insulating member 24 is provided between some of the insulating members 23 adjacent to each other in the X-direction. For example, the insulating members 23 and 24 are formed of silicon oxide (SiO).

In the Z-direction, the lengths of the columnar member 22, the insulating member 23, and the insulating member 24 are substantially equal to the height of the stacked body 20; and, for example, the columnar member 22, the insulating member 23, and the insulating member 24 each pierce the stacked body 20. The columnar member 22, the insulating member 23, and the insulating member 24 contact each other and are arranged in one column between the two word lines 21 adjacent to each other in the Y-direction. Thereby, one wall-shaped member 28 that spreads along the XZ plane is formed of the columnar members 22, the insulating members 23, and the insulating members 24 arranged in one column along the X-direction.

Insulating films 25 are provided between the word lines 21 adjacent to each other in the Z-direction. The insulating films 25 are formed of, for example, silicon oxide. Thereby, the word lines 21 and the insulating films 25 are arranged alternately along the Z-direction inside the stacked body 20. One wall-shaped member 29 that spreads along the XZ plane is formed of the word lines 21 and the insulating films 25 arranged alternately in one column along the Z-direction. The wall-shaped member 28 and the wall-shaped member 29 are arranged alternately along the Y-direction.

A core member 30 that is made of, for example, silicon oxide is provided in the columnar member 22. The configuration of the core member 30 is a substantially circular column of which the central axis extends in the Z-direction. A silicon pillar 31 that is made of, for example, silicon is provided at the periphery of the core member 30. A tunneling insulating film 32 is provided at the periphery of the silicon pillar 31. Although the tunneling insulating film 32 normally is insulative, the tunneling insulating film 32 is a film in which a tunneling current is caused to flow when a prescribed voltage is applied from the drive circuit portion 12, and is, for example, a single-layer silicon oxide film or an ONO film in which a silicon oxide layer, a silicon nitride layer, and a silicon oxide layer are stacked in this order.

A charge storage film 33 is provided at the periphery of the tunneling insulating film 32. The charge storage film 33 is a film that can store charge, is made from, for example, an insulating material having trap sites of electrons, and is made of, for example, silicon nitride (SiN). A blocking insulating film 34 is provided at the periphery of the charge storage film 33. The blocking insulating film 34 is a film in which a current substantially does not flow even when a voltage is applied from the drive circuit portion 12. The blocking insulating film 34 is, for example, a single-layer silicon oxide film or a stacked film made of a silicon oxide layer and an aluminum oxide layer.

The silicon pillar 31, the tunneling insulating film 32, the charge storage film 33, and the blocking insulating film 34 are disposed on substantially the entire side surface of the core member 30; and the configurations of these components are substantially circular tubes. The lower end of the silicon pillar 31 is connected to the silicon substrate 10.

An insulating film 41 is provided on the stacked body 20; and plugs 42 are provided inside the insulating film 41. Bit lines 43 that extend in the Y-direction are provided on the insulating film 41. The bit lines 43 are connected to the upper ends of the silicon pillars 31 via the plugs 42. The insulating film 41, the plugs 42, and the bit lines 43 are not illustrated in FIG. 2.

Thereby, as shown in FIG. 4, memory cell transistors 36 are configured by the charge storage film 33 being disposed between the word lines 21 and the silicon pillars 31. In each of the memory cell transistors 36, the word line 21 is used as a gate; the silicon pillar 31 is used as a body including a channel; the tunneling insulating film 32 and the blocking insulating film 34 are used as a gate insulating film; and the charge storage film 33 is used as a charge storage member. An upper selection transistor 37 is configured between the silicon pillar 31 and the word line 21 of the uppermost level or the word lines 21 of multiple levels from the uppermost level. On the other hand, a lower selection transistor 38 is configured between the silicon pillar 31 and the word line 21 of the lowermost level or the word lines 21 of multiple levels from the lowermost level.

As a result, the multiple memory cell transistors 36 are connected in series along each of the silicon pillars 31; and two columns of NAND strings 39 are formed. The upper selection transistor 37 is provided at the upper portion of each of the NAND strings 39; and the lower selection transistor 38 is provided at the lower portion of each of the NAND strings 39.

The lower ends of the NAND strings 39 each are connected to the silicon substrate 10; and the upper ends of the NAND strings 39 each are connected to the bit line 43.

Thereby, two NAND strings 39 are connected in parallel between the silicon substrate 10 and one bit line 43. The two NAND strings 39 share one silicon pillar 31 as a channel.

On the other hand, in the drive circuit portion 12 as shown in FIG. 1, an inter-layer insulating film (not illustrated) is provided on the silicon substrate 10. The inter-layer insulating film covers the end portion of the stacked body 20. The end portion of the stacked body 20 has a staircase configuration in which terraces are formed every word line 21. In the drive circuit portion 12, circuit elements such as transistors, resistors, etc., conductive members such as interconnects, vias, etc., are formed inside the inter-layer insulating film and the upper layer portion of the silicon substrate 10; and a drive circuit 50 includes these components. The drive circuit 50 applies prescribed potentials to the silicon substrate 10, the word lines 21, and the bit lines 43.

A method for driving the semiconductor memory device according to the embodiment will now be described.

Figure 5:
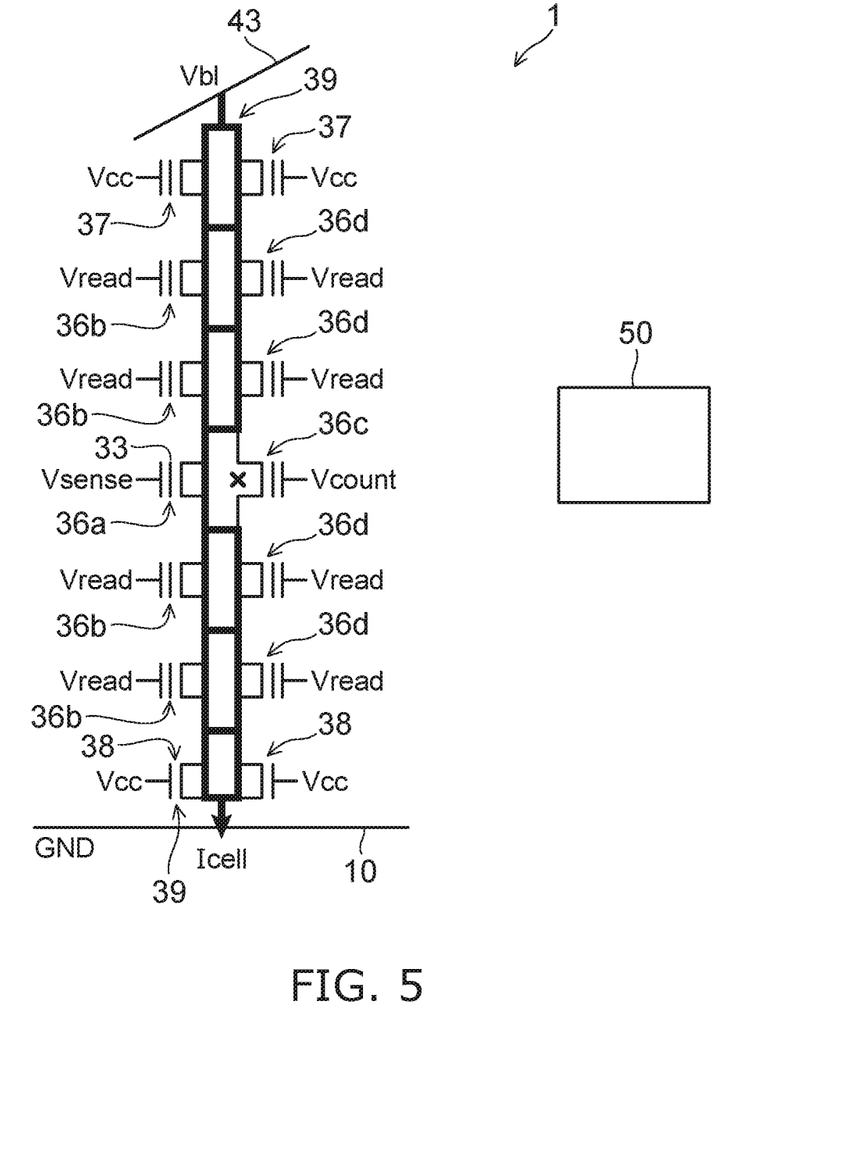
FIG. 5 is a circuit diagram showing a method for driving the semiconductor memory device according to the first embodiment.

FIG. 5 is a circuit diagram showing the method for driving the semiconductor memory device according to the embodiment.

In the semiconductor memory device 1 according to the embodiment as shown in FIG. 4, the threshold of the memory cell transistor 36 in which negative charge, i.e., electrons, is stored in the charge storage film 33 is higher than the threshold of the memory cell transistor 36 in which the negative charge is not stored in the charge storage film 33. By utilizing this phenomenon, a value can be programmed to any memory cell transistor 36 by injecting electrons into the charge storage film 33 of the memory cell transistor 36. The value can be read from the memory cell transistor 36 by determining the threshold of the memory cell transistor 36. The value of the memory cell transistor 36 can be erased by causing the electrons stored in the charge storage film 33 to disappear.

A read operation of the semiconductor memory device 1 according to the embodiment will now be described.

In the read operation, the value that is programmed to some memory cell transistor 36 is determined by the drive circuit 50 evaluating the amount of charge stored in the charge storage film 33 of the memory cell transistor 36.

For convenience of description hereinbelow as shown in FIG. 5, some of the memory cell transistors 36 are differentiated from the other memory cell transistors 36 by individually marking with names and reference numerals.

The memory cell transistor 36 of the data that is to be read is called a "selected cell 36a." The other memory cell transistors 36 that belong to the same NAND string 39 as the selected cell 36a are called "unselected cells 36b." The unselected cells 36b are arranged in the Z-direction when viewed from the selected cell 36a. The memory cell transistor 36 that opposes the selected cell 36a and is among the memory cell transistors 36 belonging to the other NAND string 39 sharing the silicon pillar 31 with the NAND string 39 to which the selected cell 36a and the unselected cells 36b belong, that is, the memory cell transistor 36 that has the same position in the Z-direction as the selected cell 36a, is called an "opposing cell 36c." The opposing cell 36c is arranged in the Y-direction when viewed from the selected cell 36a. The memory cell transistors 36 that oppose the unselected cells 36b and are among the memory cell transistors 36 belonging to the other NAND string 39 described above are called "obliquely-positioned cells 36d." The obliquely-positioned cells 36d are respectively arranged in the Y-direction when viewed from the unselected cells 36b, and are arranged in the Z-direction when viewed from the opposing cell 36c.

In other words, a pair is formed of the NAND string 39 to which the selected cell 36a and the unselected cells 36b belong and the NAND string 39 to which the opposing cell 36c and the obliquely-positioned cells 36d belong; and the pair shares one silicon pillar 31 as the channel.

In the read operation, the drive circuit 50 applies a read potential Vread to the word lines 21 of the unselected cells 36b. The read potential Vread is a potential such that the portion of the silicon pillar 31 opposing the charge storage film 33 is set to the conducting state regardless of whether or not a charge is stored in the charge storage film 33, e.g., 7 to 9 V (volts). Thereby, the unselected cells 36b are set to the conducting state regardless of the programmed values.

The drive circuit 50 applies a counter potential Vcount to the word line 21 of the opposing cell 36c. The counter potential Vcount is a potential such that the portion of the silicon pillar 31 opposing the charge storage film 33 is set to the nonconducting state regardless of whether or not a charge is stored in the charge storage film 33, and is lower than the read potential Vread, e.g., a ground potential, i.e., 0 V. Thereby, the opposing cell 36c is set to the nonconducting state regardless of the programmed value.

The drive circuit 50 applies the read potential Vread to the word lines 21 of the obliquely-positioned cells 36d. Thereby, the obliquely-positioned cells 36d are set to the conducting state regardless of the programmed values. Also, due to the capacitive coupling with these word lines 21, the potential, i.e., the body potential, of the silicon pillar 31 is stepped-up to become, for example, about +1 V.

The drive circuit 50 applies an on-state potential Vcc to the word line 21 of the upper selection transistor 37 and the word line 21 of the lower selection transistor 38. Thereby, the upper selection transistor 37 and the lower selection transistor 38 are set to the conducting state. Also, the drive circuit 50 applies a ground potential GND to the silicon substrate 10 and applies a positive bit line potential Vbl to the bit line 43. The absolute value of the potential difference between the counter potential Vcount and the potential of the silicon substrate 10 is less than the absolute value of the potential difference between the read potential Vread and the potential of the silicon substrate 10.

Thus, the upper selection transistor 37 and the lower selection transistor 38 are set to the conducting state; the portion of the silicon pillar 31 corresponding to the unselected cells 36b and the portion of the silicon pillar 31 corresponding to the obliquely-positioned cells 36d also are set to the conducting state; the portion of the silicon pillar 31 corresponding to the opposing cell 36c is set to the nonconducting state; and the voltage (Vbl) is applied between the bit line 43 and the silicon substrate 10. As a result, a current flows through the silicon pillar 31 from the bit line 43 toward the silicon substrate 10 and is dependent on the conducting state of the selected cell 36a. The current is called an "on-current Icell." The magnitude of the on-current Icell is dependent on the threshold of the selected cell 36a.

In this state, the drive circuit 50 applies a sense potential Vsense to the word line 21 of the selected cell 36a. For example, the drive circuit 50 sweeps the sense potential Vsense from the ground potential to about the read potential Vread. In other words, Vcount<Vsense<Vread. Then, the drive circuit 50 reads the value programmed to the selected cell 36a by determining the threshold of the selected cell 36a by measuring the change of the on-current Icell. In other words, the drive circuit 50 evaluates the amount of charge stored in the charge storage film 33.

Effects of the embodiment will now be described.

In the read operation in the embodiment, the drive circuit 50 applies the read potential Vread to the word lines 21 of the obliquely-positioned cells 36d. Thereby, the potential of the silicon pillar 31 is stepped-up by the capacitive coupling with these word lines 21. As a result, the thresholds of the unselected cells 36b opposing the obliquely-positioned cells 36d appear to decrease; and the on-current Icell increases. This effect is called the "body effect." On the other hand, because the drive circuit 50 applies the counter potential Vcount to the word line 21 of the opposing cell 36c, the apparent fluctuation of the threshold of the selected cell 36a is suppressed.

The drive circuit 50 sets the obliquely-positioned cells 36d to the conducting state by applying the read potential Vread to the word lines 21 of the obliquely-positioned cells 36d. As a result, the obliquely-positioned cells 36d also are used as a path of the on-current in addition to the unselected cells 36b. Thereby, the on-current Icell increases. At this time, the opposing cell 36c is set to the nonconducting state because the drive circuit 50 applies the counter potential Vcount to the word line 21 of the opposing cell 36c. As a result, the on-current constantly flows through the selected cell 36a side of the portion of the silicon pillar 31 shared by the selected cell 36a and the opposing cell 36c; therefore, the threshold of the selected cell 36a can be determined accurately without being affected by the value programmed to the opposing cell 36c. Thereby, misreads can be suppressed.

Thus, according to the embodiment, the on-current Icell of the read operation can be increased while suppressing effects on the threshold of the selected cell 36a. As a result, the data that is programmed to the memory cell transistor 36 can be read with high precision even in the case where the silicon pillars 31 are downscaled.

Second Embodiment

A second embodiment will now be described.

The method of the read operation of the embodiment is different from that of the first embodiment described above.

Figure 6:
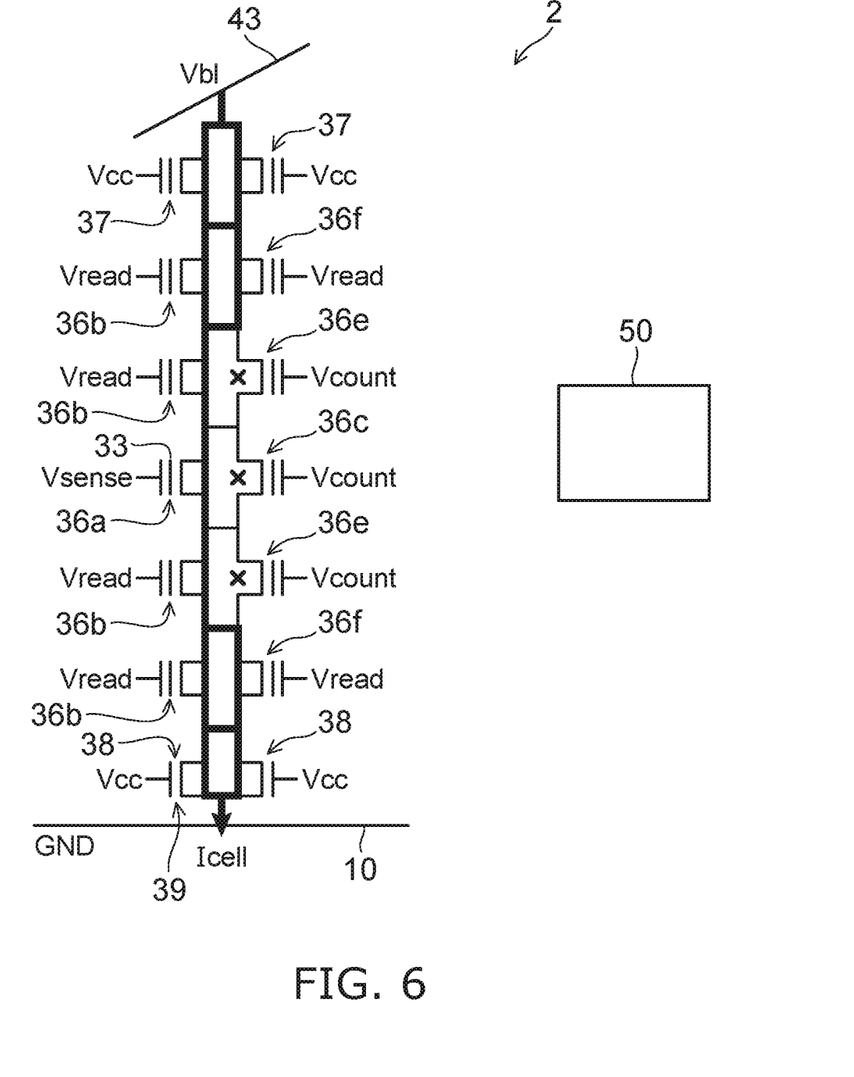
FIG. 6 is a circuit diagram showing the method for driving the semiconductor memory device according to a second embodiment.

FIG. 6 is a circuit diagram showing the method for driving the semiconductor memory device according to the embodiment.

In the semiconductor memory device 2 according to the embodiment as shown in FIG. 6, the obliquely-positioned cells 36d are further divided into two groups. Specifically, the memory cell transistors 36 of the obliquely-positioned cells 36d disposed adjacent to the opposing cell 36c are called "adjacent cells 36e." The memory cell transistors 36 of the obliquely-positioned cells 36d other than the adjacent cells 36e are called "nonadjacent cells 36f."

In the read operation, the drive circuit 50 applies the counter potential Vcount instead of the read potential Vread to the word lines 21 of the adjacent cells 36e. The drive circuit 50 applies the read potential Vread to the word lines 21 of the nonadjacent cells 36f.

In the read operation in the embodiment, the drive circuit 50 applies the counter potential Vcount to the word lines 21 of the adjacent cells 36e; thereby, the voltage of the portion of the silicon pillar 31 corresponding to the selected cell 36a (referring to FIG. 2 and FIG. 3) can be more reliably prevented from being stepped-up; and the threshold of the selected cell 36a can be determined more accurately. In other words, the body effect for the selected cell 36a can be suppressed.

Otherwise, the configuration, the operations, and the effects of the embodiment are similar to those of the first embodiment described above.

Although an example is shown in the embodiment in which one memory cell transistor 36 on the upper side of the opposing cell 36c and one memory cell transistor 36 on the lower side of the opposing cell 36c are used as the adjacent cells 36e and the counter potential Vcount is applied to the word lines 21 of the adjacent cells 36e, this is not limited thereto. Multiple memory cell transistors 36 on at least one of the upper side or the lower side of the opposing cell 36c may be used as the adjacent cells 36e; and the counter potential Vcount may be applied to the word lines 21 of these multiple memory cell transistors 36. Thereby, the body potential of the selected cell 36a can be more reliably prevented from increasing; and the read operation of the selected cell 36a can be performed more reliably. However, the body effect for the unselected cells 36b decreases as the number of adjacent cells 36e to which the counter potential Vcount is applied increases. Also, the current path of the on-current Icell becomes finer because the number of the nonadjacent cells 36f set to the conducting state decreases. Therefore, the on-current Icell decreases.

Although an example is shown in the embodiment in which the charge storage film 33 is formed of an insulating material and the configuration of the charge storage film 33 is a tubular configuration surrounding the silicon pillar 31, this is not limited thereto. For example, the charge storage film 33 may be formed of a conductive material such as, for example, polysilicon, etc.; and the charge storage film 33 may be divided at each crossing portion between the silicon pillar 31 and the word lines 21. Thereby, one charge storage film 33 that is insulated from the periphery is provided for each memory cell transistor 36. As a result, the data retention characteristics of the memory cell transistor 36 improve.

Although an example is shown in the embodiment in which the drive circuit 50 is provided inside the drive circuit portion 12 disposed at the side of the memory portion 11, this is not limited thereto. The drive circuit 50 may be provided between the silicon substrate 10 and the stacked body 20. In such a case, an inter-layer insulating film is provided on the silicon substrate 10; a source line is provided on the inter-layer insulating film; and the stacked body 20 is provided on the source line. Then, the drive circuit 50 is formed inside the inter-layer insulating film and the upper layer portion of the silicon substrate 10. The silicon pillar 31 is connected to a source line instead of the silicon substrate 10. In the read operation, the ground potential GND is applied to the source line. By disposing the drive circuit 50 between the silicon substrate 10 and the stacked body 20, the semiconductor memory device can be downsized even more.

According to the embodiments described above, a semiconductor memory device and a method for driving the semiconductor memory device can be realized in which the on-current of the read operation is large.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a first interconnect;
a second interconnect;
a first NAND string and a second NAND string sharing a channel and being connected in parallel between the first interconnect and the second interconnect; and
a drive circuit,
the first and second NAND strings each including a plurality of memory cell transistors connected in series,
when reading a value from a first memory cell transistor of the plurality of memory cell transistors belonging to the first NAND string, the drive circuit is configured to perform:
   applying a first potential to a gate of a second memory cell transistor of the plurality of memory cell transistors belonging to the first NAND string other than the first memory cell transistor,
   applying a second potential to a gate of a third memory cell transistor of the plurality of memory cell transistors belonging to the second NAND string, the third memory cell transistor opposing the first memory cell transistor, an absolute value of a potential difference between the second potential and a potential of the first interconnect being less than an absolute value of a potential difference between the first potential and the potential of the first interconnect,
   applying the first potential to a gate of at least one of fourth memory cell transistors of the plurality of memory cell transistors belonging to the second NAND string, the fourth memory cell transistor opposing the second memory cell transistor and being nonadjacent to the third memory cell transistor,
   applying the second potential to a gate of a fifth memory cell transistor of the plurality of memory cell transistors belonging to the second NAND string, the fifth memory cell transistor being adjacent to the third memory cell transistor,
   applying the second potential to a gate of a sixth memory cell transistor of the plurality of memory cell transistors belonging to the second NAND string, the sixth memory cell transistor being adjacent to the fifth memory cell transistor, and
   sweeping a gate potential of the first memory cell transistor between the second potential and the first potential.

2. The device according to claim 1, wherein the drive circuit measures a current flowing in the channel and applies a voltage between two end portions of the channel when reading the value from the first memory cell transistor.

3. The device according to claim 1, wherein when reading the value from the first memory cell transistor, the drive circuit is configured to apply the second potential to a gate of a seventh memory cell transistor of the plurality of memory cell transistors belonging to the second NAND string, the seventh memory cell transistor being adjacent to the third memory cell transistor, the third memory cell transistor being disposed between the fifth memory cell transistor and the seventh memory cell transistor.

4. A semiconductor memory device, comprising:
a plurality of interconnects extending in a first direction and being arranged along a second direction and a third direction, the second direction crossing the first direction, the third direction crossing a plane including the first direction and the second direction;
a plurality of semiconductor members extending in the second direction and being disposed between two interconnects of the plurality of interconnects adjacent to each other in the third direction;
a charge storage member disposed between one of the semiconductor members and a first interconnect of the plurality of interconnects; and
a drive circuit configured to, when evaluating an amount of charge stored in the charge storage member,
   apply a voltage between two end portions of the one of the semiconductor members,
   apply a potential for evaluating the amount of charge to the first interconnect,
   apply a first potential to a second interconnect of the plurality of interconnects,
   apply a second potential to a third interconnect of the plurality of interconnects,
   apply the first potential to at least one of a plurality of fourth interconnects of the plurality of interconnects,
   apply the second potential to a fifth interconnect of the plurality of interconnects, and
   apply the second potential to a sixth interconnect of the plurality of interconnects,
the one of the semiconductor members being settable to a conducting state by the first potential,
the second interconnect being arranged in the second direction when viewed from the first interconnect,
the third interconnect being arranged in the third direction when viewed from the first interconnect,
the one of the semiconductor members being interposed between the third interconnect and the first interconnect,
the one of the semiconductor members being settable to a nonconducting state by the second potential,
the plurality of fourth interconnects being arranged in the second direction when viewed from the third interconnect and being nonadjacent to the third interconnect in the second direction,
the fifth interconnect being adjacent to the third interconnect in the second direction, and
the sixth interconnect being adjacent to the fifth interconnect in the second direction.

5. The device according to claim 4, wherein the drive circuit sweeps a potential for evaluating the amount of charge.

6. The device according to claim 4, wherein the first potential is higher than the second potential.

7. The device according to claim 4, wherein
the charge storage member is insulative, and
a configuration of the charge storage member is a tubular configuration surrounding the one of the semiconductor members.

8. The device according to claim 4, further comprising first insulating members, one of the first insulating members being provided between two of the semiconductor members adjacent to each other in the first direction.

9. The device according to claim 8, further comprising a second insulating member provided between two of the first insulating members adjacent to each other in the first direction, a length of the second insulating member in the third direction being longer than a length of the first insulating member in the third direction.

10. The device according to claim 4, wherein when evaluating the amount of charge stored in the charge storage member, the drive circuit is configured to apply the second potential to a seventh interconnect of the plurality of interconnects, the seventh interconnect being adjacent to the third interconnect, the third interconnect being disposed between the fifth interconnect and the seventh interconnect.

11. A method for driving a semiconductor memory device, the device including a first NAND string and a second NAND string sharing a channel and being connected in parallel between a first interconnect and a second interconnect, the first and second NAND strings each including a plurality of memory cell transistors connected in series, the method comprising, when reading a value from a first memory cell transistor of the plurality of memory cell transistors belonging to the first NAND string:

applying a first potential to a gate of a second memory cell transistor of the plurality of memory cell transistors belonging to the first NAND string other than the first memory cell transistor;

applying a second potential to a gate of a third memory cell transistor of the plurality of memory cell transistors belonging to the second NAND string, the third memory cell transistor opposing the first memory cell transistor, an absolute value of a potential difference between the second potential and a potential of the first interconnect being less than an absolute value of a potential difference between the first potential and the potential of the first interconnect;

applying the first potential to a gate of at least one of fourth memory cell transistors of the plurality of memory cell transistors belonging to the second NAND string, the fourth memory cell transistor opposing the second memory cell transistor and being nonadjacent to the third memory cell transistor;

applying the second potential to a gate of a fifth memory cell transistor of the plurality of memory cell transistors belonging to the second NAND string, the fifth memory cell transistor being adjacent to the third memory cell transistor;

applying the second potential to a gate of a sixth memory cell transistor of the plurality of memory cell transistors belonging to the second NAND string, the sixth memory cell transistor being adjacent to the fifth memory cell transistor; and sweeping a gate potential of the first memory cell transistor between the second potential and the first potential.

12. The method according to claim 11, further comprising, when reading the value from a first memory cell transistor, applying the second potential to a gate of a seventh memory cell transistor of the plurality of memory cell transistors belonging to the second NAND string, the seventh memory cell transistor being adjacent to the third memory cell transistor, the third memory cell transistor being disposed between the fifth memory cell transistor and the seventh memory cell transistor.

* * * * *